United States Patent [19]

Lewiner et al.

[11] Patent Number: 5,247,260
[45] Date of Patent: Sep. 21, 1993

[54] METHODS AND APPARATUSES FOR DETERMINING THE DISTRIBUTION OF ELECTRIC CHARGE IN ELECTRICAL INSULATORS PRODUCED BY A SUDDEN DEFORMATION IN THE INSULATORS

[76] Inventors: Jacques Lewiner, 7 Avenue de Suresnes, 92210 Saint Cloud; Claude Alquie née Thibault, 41 Rue de la Fontaine Grelot Bat. 2, 92340 Bourg La Reine, both of France

[21] Appl. No.: 875,011

[22] Filed: Apr. 28, 1992

[30] Foreign Application Priority Data

Apr. 29, 1991 [FR] France ................. 91 05245

[51] Int. Cl.⁵ .......................................... G01N 27/00
[52] U.S. Cl. ...................................... 324/557; 73/780
[58] Field of Search ............. 324/557, 541, 544, 551, 324/663; 73/780

[56] References Cited

FOREIGN PATENT DOCUMENTS 2633054 12/1989 France .

OTHER PUBLICATIONS

IEEE Transactions on Nuclear Science, vo. NS-29, No. 6, Dec. 1982, New York US, pp. 1644-1649, Sessler et al.
Revue Generale De L'Electricite, No. 3, Mar. 1988, Paris, France, pp. 37-43, Alquie et Lewinder: "La Mesure Des Champs Electriques ... ".

*Primary Examiner*—Walter E. Snow
*Attorney, Agent, or Firm*—Larson and Taylor

[57] ABSTRACT

Investigation apparatus for investigating the distribution of electric charge (2) within an insulator (1) comprises: a function generator (7) suitable for generating a time-varying electrical voltage v, an amplifier (8) suitable for amplifying the voltage from the function generator, the voltage V amplified in this way being applied to the terminals of electrodes (3,4) on either side of the insulator, apparatus (9) suitable for creating sudden deformations that propagate within the insulator, a delay circuit (10) synchronized with the function generator and suitable for triggering the apparatus for creating deformations at a recurrence frequency $f_r$ lying in the range 500 Hz to 50000 Hz, means (11) for successively recording sequences S of signals appearing at the terminals of the electrodes on each occasion that one of the recurrent deformations passes through the insulator and means (12) for processing the sequences S of signals recorded in this way so as to cause the desired electrical distribution within the insulator to appear.

11 Claims, 1 Drawing Sheet

METHODS AND APPARATUSES FOR DETERMINING THE DISTRIBUTION OF ELECTRIC CHARGE IN ELECTRICAL INSULATORS PRODUCED BY A SUDDEN DEFORMATION IN THE INSULATORS

The invention relates to methods and apparatuses for studying electrical insulators, and more particularly for determining the distribution of certain electrical parameters (charge, polarization, field, ...) within such insulators.

A particular purpose of such studies is to discover how insulators behave when high potential differences are applied thereto, as occurs, for example, with the insulating coverings of cables for conveying electrical power at high voltage, in particular at several tens of kilovolts.

By knowing how the insulators in question behave, it is possible to adapt the thicknesses and compositions thereof as a function of requirements, and to apply corrective action thereto, possibly locally, to improve their performance, and in particular to avoid breakdown.

In a first known embodiment (French patent application No. 88 08212 corresponding to French Patent No. 2,633,054), proposals are made to place an insulator between two electrodes having a direct potential difference applied therebetween, and then to generate a deformation that propagates through the insulator from one electrode to the other, with the time $t_0$ required to establish each deformation being much shorter than the time $t_1$ required for said deformation to travel through the insulator, and then to amplify the electrical signals picked up at the terminals of the electrodes while said deformation is travelling and to record the sequence of such signals so that use can be made of them.

This can be done by providing images of the distribution within the insulator of electrical parameters (charge or other) present locally within the insulator and suitable for inducing electrical phenomena (charge or other) at the electrodes.

In a second known embodiment (see article by T. Maeno et al., published at pages 433 to 439 of IEEE Transactions on Electrical Insulation, No. 3, Vol. 23, June 1988), proposals are still made to place an insulator between two electrodes between which a direct potential difference is applied and then to generate a deformation that propagates through the insulator, this time based on electrical charge present in the insulator by applying a voltage pulse having a very short rise time between the electrodes: the electric field then suddenly generated in the insulator applies pressure on said charge, which pressure propagates towards the electrodes and can be detected at at least one of them by a suitable electromechanical transducer such as a piece of piezoelectric material glued against the electrode under consideration and itself extending between two auxiliary electrodes.

Under such circumstances, the electrical signal (current or voltage) appearing across the terminals of the transducer is an image of the charge or other distribution to be detected.

Each of these concepts makes it possible to know the "electrical" distribution in question within the insulator under investigation, but only in the event of said distribution being permanent, given that the potential difference applied to the insulator is direct (DC) and therefore does not vary during the measurement.

However, in some applications it may be desirable to observe the way the electrical distribution in question varies as a function of variations in a potential difference applied to the terminals of the electrodes, while said variations are taking place.

In particular, the potential difference may be alternating, as applies to the electrical insulation used for making the coverings of cables for transporting AC.

For example, under such circumstances, it may be of great value to know how the distribution of electrical charge varies through the thickness of the insulator while said alternating voltage is being applied to said insulator, thus making it possible to establish, by progressively increasing the amplitude of the voltage, up to what threshold of said amplitude the insulator under investigation gives satisfaction.

Above all, the object of the invention is to make it possible for such investigation to be instantaneous, i.e. for it to be performed simultaneously with alternating voltages being applied to the terminals of the electrodes between which the insulator under investigation is placed.

To this end, advantage is taken of the following observation.

If the frequency of the alternating voltage under consideration is relatively low and if the thickness of the layer of insulator under investigation is sufficiently thin, then the duration $t_1$ taken by the above-mentioned wave of deformation to travel through said insulator is very small relative to the period T of the alternating voltage, or more precisely relative to the quarter period, i.e. T/4, which defines the corresponding variation in amplitude.

Thus, given that the propagation velocity of the wave of deformation in conventional insulators is of the order of 2000 meters per second (m/s), and if the thickness of the insulator under investigation is 2 mm, then the duration $t_1$ is 1 $\mu$s, i.e. 5000 times smaller than the quarter period T/4 of the alternating voltage if the frequency of said voltage is 50 Hz.

Consequently, great latitude is available for sampling the measurement by subdividing the time corresponding to the quarter period under consideration into a certain number N of measurement sections that are separated from one another by a recurrence time $t_r$.

Even with a reasonable value for the number N, the recurrence time $t_r$ can be given a value which, as is necessary, is both considerably greater than the duration $t_1$ of each measurement and considerably smaller than T/4.

In the above example, the recurrence time $t_r$ is advantageously about 1 ms, which corresponds to the value of N being 5.

More generally, said time $t_r$ lies in the range 20 $\mu$s to 2 ms.

In other words, the methods of the invention for investigating electrical insulators make use, like the above-defined methods, of the following sequence of operations: placing a mass of the insulator to be investigated between two electrodes; applying a high potential difference to the terminals of said electrodes; creating a sudden deformation in the insulator, which deformation propagates within said insulator; amplifying the electrical signals generated by said propagation; recording the sequence S of signals as amplified in this way; and processing the recorded signals so as to cause the desired electrical distribution in the insulator to appear; the method being characterized in that the potential difference is given a value that is variable, in that the creation of the deformation is renewed at a recurrence frequency $f_r$ lying in the range 500 Hz to 50000 Hz, in that successive multiple sequences S of signals corresponding to respective successive propagations of the recurrent deformations within the insulator are recorded, and in that the sequences S recorded in this way are processed so as to show up the desired electrical distribution within the insulator.

Apparatuses of the invention for investigating insulators are essentially characterized in that they comprise: a function generator suitable for generating a time-varying electrical voltage, an amplifier suitable for amplifying the voltage from the function generator, the voltage amplified in this way being applied to the terminals of electrodes on either side of the insulator, apparatus suitable for creating sudden deformations that propagate within the insulator, a delay circuit synchronized with the function generator and suitable for triggering the apparatus for creating deformations at a recurrence frequency $f_r$ lying in the range 500 Hz to 50000 Hz, means for successively recording multiple sequences S of signals relating to the electrical signals generated by the successive propagations of the recurrent deformations within the insulator, and means for processing the sequences S of signals recorded in this way so as to cause the desired electrical distribution within the insulator to appear.

In preferred embodiments, use is also made of one or more of the following dispositions:

the variable voltage or potential difference is a sinewave voltage whose amplitude increases over time, preferably in adjustable manner;

the frequency of the sinewave voltage is equal to 50 Hz or to 60 Hz;

both a highpass filter for passing components at the frequency $f_r$ and at low voltage in the voltage picked up at the terminals of the electrodes, and an amplifier for amplifying the voltage delivered by said highpass filter are provided between the electrodes and the recording means;

a gate is provided between the amplifier of the preceding paragraph and the recording means, the opening in time of the gate being of a duration less than the time taken by each deformation to cross through the insulator, said opening being triggered on each occasion that a deformation is crossing through the insulator, by a signal of adjustable delay and synchronized on the function generator; and the deformation-creating apparatus is a laser suitable for emitting pulses of a few ns duration at a frequency of the order of 500 Hz to 5000 Hz.

In addition to the above main dispositions, the invention includes certain other dispositions which are preferably used together therewith and which are dealt with in greater detail below.

Various preferred embodiments of the invention are described below with reference to the accompanying drawing, and naturally in a manner that is not limiting. In the drawing.

Figure 1:
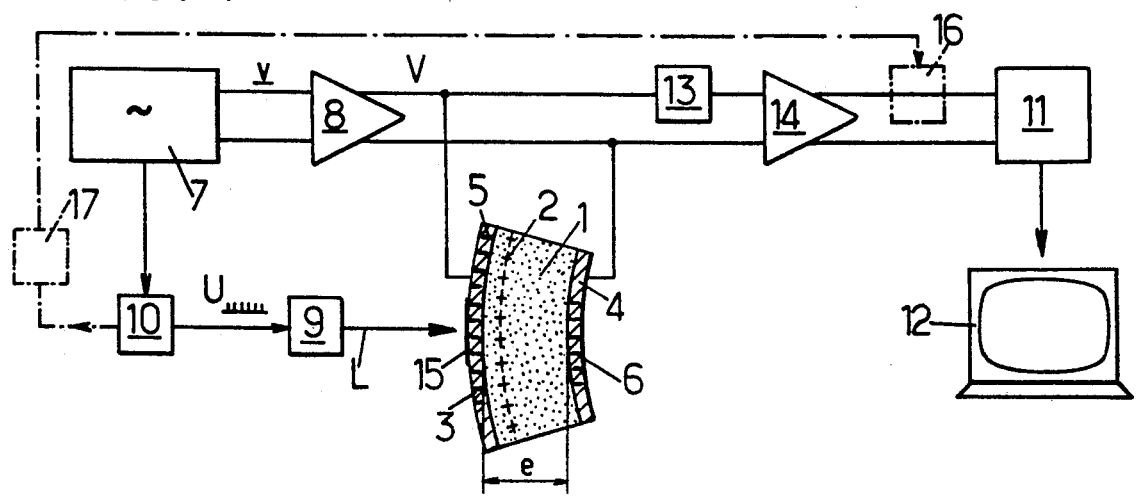
FIG. 1 is a circuit diagram of apparatus for investigating electrical insulation and set up in accordance with the invention.

The object is to study the distribution of electrical parameters (charge, polarization, field, . . . ) within an insulator 1 (FIG. 1) assumed in this case to be part of an insulating covering for a cable that transports alternating electrical power.

Purely by way of example, it is assumed that the above parameter in this case is electric charge 2 as represented by plus signs "+".

Two electrodes 3 and 4 are placed on either side of the insulator 1 and they carry electric charge 5, 6 induced by the charge 2 and represented in this case, purely by way of example, by minus signs "−".

The electrodes 3 and 4 constitute the plates of a capacitor.

The apparatus for investigating the distribution of electric charge 2 comprises:

a function generator 7 suitable for generating an electrical voltage v that varies in time with a waveform, a frequency, and an amplitude that are all adjustable;

an amplifier 8 for amplifying said voltage v and suitable for transforming it into a voltage V of relatively large amplitude, which voltage V is applied to the terminals of the electrodes 3 and 4;

apparatus 9 suitable for continuously creating sudden deformations in the insulator 1;

a delay circuit 10 synchronized with the zero crossing of the voltage v generated by the generator 7 and suitable for generating a sequence of pulses U for triggering the apparatus 9, which pulses follow one another at a recurrence frequency $f_r$; and a recording and calculating unit 11 connected to the terminals of the two electrodes 3 and 4 (or of an equivalent member) in such a manner as to detect and pick up the sequences S of the signals generated between these terminals on the successive occasions that the above deformation propagates through the insulator 1, and then to process said sequences for subsequent display thereof, together with display means or the like 12 such as an oscilloscope suitable for showing the distribution of charge 2 in the insulator 1 on the basis of the data recorded and processed in this way.

The frequency $f_r$ is about 1000 Hz, and more generally lies in the range 500 Hz to 50000 Hz. These values correspond to the values given above for the corresponding recurrence period $t_r$, specified as being about 1 ms, and more generally as lying in the range 20 μs to 2 ms.

To make it easier for the unit 11 to detect the wanted signals, the following are interposed between said unit and the electrodes 3 and 4;

a highpass filter 13 suitable for passing only those components which are at a relatively high frequency $f_r$ and at a relatively low voltage constituted by the electrical voltage detected at the terminals of said electrodes; and an amplifier 14 suitable for amplifying the signals that have passed through the filter 13.

The variable voltage v delivered by the generator 7 may be of any desirable waveform.

In an advantageous embodiment, it is constituted by an alternating voltage, and more precisely by a sinewave whose frequency f is preferably equal to 50 Hz or to a similar frequency, for example 60 Hz.

In addition, means are advantageously provided for adjusting at will the amplitude of said alternating voltage v, and in particular enabling said amplitude to increase progressively.

In the preferred case of a sinewave voltage, the amplifier 8 is constituted by a transformer.

Figure 2:
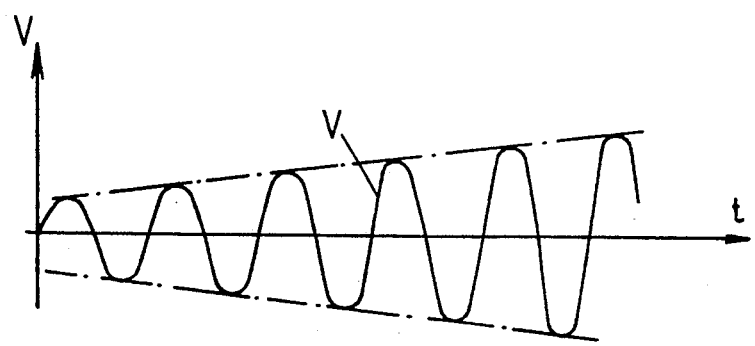
FIG. 2 is a waveform diagram showing an alternating electrical voltage advantageously applied to the terminals of the electrodes on either side of said insulation.

FIG. 2 shows the resulting amplified waveform V at frequency f, with a period T of 20 ms in the preferred case where the frequency f is equal to 50 Hz.

The amplification ratio lies, in particular, in the range 1000 to 10000 and the amplitude of the voltage V is of the order of 20 kV to 60 kV, and said value may even reach or exceed 200 kV.

Figure 3:
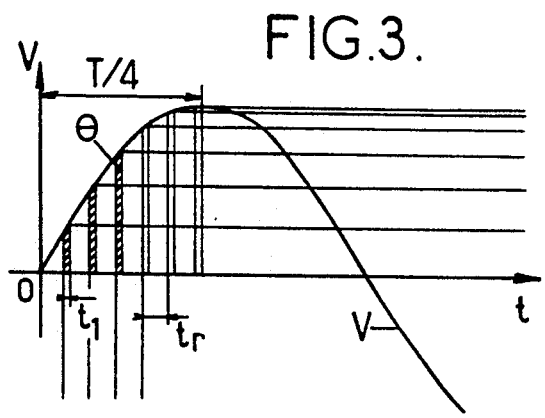
FIG. 3 shows a portion of said voltage waveform on a larger scale.

FIG. 3 is a magnification of one of the half-cycles of the voltage V.

The apparatus 9 for creating deformations may be constituted in one of the manners described above using any appropriate member capable of generating sudden pressure or deformation in the insulator, i.e. requiring a relatively short set-up duration $t_0$ (e.g. of the order of a few ns), in response to an electrical triggering and synchronizing voltage pulse U being applied thereto.

Such a member may be of the piezoelectric type, for example, being suitable for transforming such a voltage pulse into a pressure pulse, which pressure pulse is applied to one of the electrodes 3 by said member being put into contact therewith.

It may also be constituted by an electron gun suitable for applying an instantaneous heat pulse to said electrode 3.

Said member may alternatively be suitable for applying an electric voltage pulse between the electrodes independently of the voltage V (except with respect to synchronization), e.g. a pulse of about 5 kV and having a very short rise time.

In preferred embodiments, the apparatus 9 in question is constituted by a laser suitable for applying light pulses to the electrode 3, and more precisely to an area 15 forming a portion of said electrode or contiguous therewith, and arranged as a target, e.g. an area constituted by a local coating of graphite, with an impedance-matching material such as a gel or a grease advantageously being interposed between said area 15 and the electrode 3 if these two items are distinct.

The light pulses from the laser 9 are represented by arrow L in FIG. 1 and they are triggered by pulses U emitted at the frequency $f_r$ by the delay circuit 10.

The laser 9 is preferably a solid state type laser suitable for emitting light pulses L of a few nanoseconds' duration at a frequency lying in the range 500 Hz to 5000 Hz.

Figure 4:
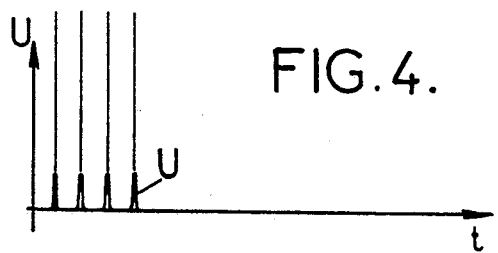
FIG. 4 shows the waveform of pulses suitable for triggering the deformation-creating apparatus included in the above apparatus.

The train of pulses U is initially synchronized with a zero crossing of the voltage V, as shown in FIG. 4, where said voltage pulses U are shown as following one another at the recurrence frequency $f_r$, i.e. as being spaced apart from one another by time intervals of period $t_r$.

As can be seen in FIG. 3, each of the pulses U corresponds to a measurement section $\theta$ (shaded in the drawing) of very short duration $t_1$ during which the voltage V which is applied to the terminals of the two electrodes 3 and 4 may be considered as having a value that is constant, to a first approximation: this very short duration $t_1$, e.g. of the order of a microsecond, is the duration that corresponds to the time taken by each of the above deformations to cross through the total thickness e of the insulator 1; it is generally about 1000 times smaller than the recurrence period $t_r$.

The measurement performed during each short section $\theta$ may be considered as being comparable to the measurement as performed by the above-mentioned known method, with the difference in this case being that said measurement is not unique, but is followed by a plurality of other measurements of the same kind corresponding to different respective polarizations of the insulator 1.

A certain number of successive measurements are performed during a single quarter period T/4 of the voltage V, each measurement extending over a duration $t_1$ and being separated from other measurements by the recurrence duration $t_r$, while the value of the electrical polarization of the insulator increases progressively, for example from 0 to the maximum amplitude of the sinewave voltage V as shown in FIG. 3.

In the more general case, all sequences S of the signals generated in succession at the terminals of the electrodes 3 and 4 are recorded in the unit 11.

To then show up the distribution of charge 2 in said insulator 1, the various sequences S corresponding to a given duration can be displayed in succession, in particular corresponding to the quarter period T/4 mentioned above.

In an advantageous variant, the full sequences of the signals that appear at the terminals of the electrodes 3 and 4 are not recorded, and only those portions of these sequences that correspond to special zones in the mass of insulator under investigation are recorded, such zones may be its inlet and outlet interfaces, i.e. its portion adjacent to the two electrodes 3 and 4.

Figure 5:
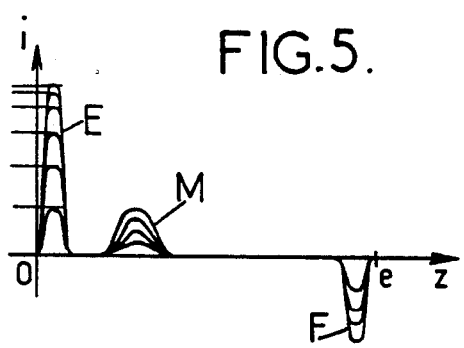
FIG. 5 shows the shape of curves that may be displayed by output means included in the above apparatus.

The graph of FIG. 5 shows a curve representing the electrical signals detected at the terminals of the electrodes 3 and 4 by plotting in ordinates the amplitude of the corresponding electrical current i as a function, in abscissae, of time t or of the distance z between the point inside the insulator 1 corresponding to the measurement being performed and the input of the insulator for the deformation under consideration, which distance is equivalent to time. The curve has a first peak E of relatively large amplitude in the vicinity of the input, and a second peak F of opposite sign and of smaller amplitude in the vicinity of the output.

The portion that is recorded of the electrical signals generated by the above installation may then be limited to the zone corresponding to one of the two peaks E and F.

This can be done merely by interposing a suitable gate 16 (FIG. 1) between the amplifier 14 and the unit 11, with the gate being opened momentarily only for a well-determined length of time $t_2$ within each measurement duration $t_1$, the signals controlling gate opening then being generated by a circuit 17 which is itself accurately synchronized relative to a zero crossing of the voltage V by means of the delay circuit 10.

Under such conditions, the sequences of recorded signals make it possible to reproduce successive input current peaks E (FIG. 5) corresponding to successive measurement sections $\theta$, for example.

The amplitudes of these successive peaks are proportional to the instantaneous electrical fields that exist in the insulator 1 in the vicinity of the input electrode 3, thus making it possible to measure the real variation of said electric field at the specified location while the alternating voltage V is being applied to the terminals of the electrodes 3 and 4.

The opening of the gate 16 may also be controlled so as to show how the amplitude of the electric field varies in any zone of the insulator 1, and in particular at a point where an electric charge 2 is located, which point is shown up by a small peak M in the current i (FIG. 5). This point may correspond, for example, to an interface of known position between two layers of insulators having different characteristics, or its location may be identified by prior detection performed in such a manner as to extend over the entire thickness of the insulator under investigation.

The above results, or more generally the results that can be taken from the various sequences of signals recorded in the unit 11 enable the variation of certain electrical phenomena that take place in an insulator subjected to alternating electrical polarization to be followed so that the process of such variation can be known exactly.

In the above-described preferred embodiment in which the amplitude of the potential difference V applied to the terminals of the electrodes on either side of the insulator under investigation can be caused to increase smoothly and adjustably (see FIG. 2), knowledge of the way in which electrical phenomena that occur in the insulator do, in fact, vary can be extremely useful in countering the appearance of faults or at least to preventing faults from leading to breakdown and destruction of the insulator under investigation.

This knowledge can also be used for optimizing the process of polarizing piezoelectric or pyroelectrical materials in which such polarization is established by applying a direct electric field.

Consequently, whatever embodiment is adopted, a method and an apparatus are obtained that make it possible to investigate non-destructively the distribution of charge or other electrical parameters within an insulator while a potential difference of variable amplitude is being applied thereto, and in particular an alternating potential difference.

Naturally, and as can be seen from the above, the invention is not limited in any way to those applications and embodiments described more particularly; on the contrary it covers any variant, and in particular:

variants in which measurement drawbacks due to multiple reflections of pressure waves at the output of at least the second electrode (the electrode reached second by said wave) are avoided by covering the electrode with an absorbant or a dissipating cushion having the same acoustic impedance as the insulator and the electrode, and of sufficient thickness for the pressure waves in question to be adequately attenuated therein, said thickness generally being a few mm to a few cm; and variants in which means are provided for compensating possible fluctuations or drift interfering with the creation of successive sudden deformations in the insulator, means suitable for measuring a parameter specific to each deformation (light intensity if a laser is being used, electric voltage, etc.), for generating a correction signal representative of variations in said parameter, and for making use of such correction signals to obtain the desired compensation.

We claim:

1. A method of investigating the distribution of electric charge or the like in an electrical insulator, the method comprising the following sequence of operations: placing a mass of the insulator to be investigated between two electrodes having terminals; applying a high potential difference to the terminals of said electrodes; creating a sudden deformation in the insulator such that the deformation propagates within said insulator and generates electrical signals; detecting and amplifying the electrical signals generated by said propagation so as to produce a sequence S of amplified signals; recording the sequence S of the amplified signals; and processing the recorded signals so as to cause the desired electrical distribution in the insulator to appear; the improvement wherein the high potential difference is of a variable value, wherein the creation of the sudden deformation is repeated at a recurrence frequency $f_r$ lying in the range 500 Hz to 50000 Hz, wherein successive multiple sequences S of signals corresponding to respective successive propagations of the recurrent deformations within the insulator are recorded, and wherein the sequences S so recorded are processed so as to show up the desired electrical distribution within the insulator.

2. Investigation apparatus for investigating the distribution of electrical charge or the like within an electrical insulator, the apparatus comprising: a function generator for generating a time-varying electrical voltage v, an amplifier for amplifying the voltage generated by the function generator to produce an amplified voltage V which is applied to terminals of electrodes on either side of the insulator, deformation-creating apparatus for creating sudden deformations that propagate within the insulator so as to generate corresponding electrical signals, a delay circuit, synchronized with the function generator, for triggering the apparatus for creating said sudden deformations at a recurrence frequency $f_r$ lying in the range of 500 Hz to 50000 Hz, recording means coupled to said insulator for detecting and successively recording multiple sequences S of signals relating to the electrical signals generated by the successive propagations of the recurrent deformations within the insulator, and means coupled to the recording means for processing the sequences S of recorded signals so as to cause the desired electrical distribution within the insulator to appear.

3. Investigation apparatus according to claim 2, characterized in that the voltage V comprises a sinewave voltage whose amplitude increases over time.

4. Investigation apparatus according to claim 3, characterized in that the frequency of the sinewave voltage is equal to 50 Hz.

5. Investigation apparatus according to claim 2, characterized in that both a highpass filter for passing components at the frequency $f_r$ and at low voltage in the electrical signals detected at the terminals of the electrodes, and an amplifier for amplifying the output voltage produced by said highpass filter are connected between the electrodes and the recording means.

6. Investigation apparatus according to claim 5, characterized in that a gate is connected between the amplifier and the recording means and to the function generator, the opening time of the gate being of a duration less than the time taken by each deformation to cross through the insulator, said opening time being triggered on each occasion that a deformation is crossing through the insulator by a signal of adjustable delay synchronized with the function generator.

7. Investigation apparatus according to claim 2, characterized in that the deformation-creating apparatus comprises a laser for emitting pulses of a few ns duration at a frequency of the order of 500 Hz to 5000 Hz.

8. Investigation apparatus according to claim 2, characterized in that at least the electrode that is most remote from the creation of the sudden deformations so as to be reached second in time by each said deformation is coated on its face spaced furthest away from the insulator by a thick cushion for absorbing the pressure wave causing said deformation.

9. Investigation apparatus according to claim 2, further comprising compensating means for compensating for possible fluctuations affecting the creation of the successive sudden deformations within the insulator, said compensating means comprising means for measuring a parameter relating to each deformation, for generating a correction signal relating to variations in said parameter, and for making use of correction signals so generated for the purpose of achieving the desired compensation.

10. Investigation apparatus according to claim 3, wherein the amplitude of said variable voltage varies in an adjustable manner.

11. Investigation apparatus according to claim 3, wherein the frequency of said sinewave voltage is equal to 60 Hz.

* * * * *